United States Patent [19]

Gottschalk

[11] 4,421,995

[45] Dec. 20, 1983

[54] TIMING DISCRIMINATOR USING LEADING-EDGE EXTRAPOLATION

[75] Inventor: Bernard Gottschalk, Palo Alto, Calif.

[73] Assignee: The United States of America as represented by the United States Department of Energy, Washington, D.C.

[21] Appl. No.: 288,562

[22] Filed: Jul. 30, 1981

[51] Int. Cl.³ .......................................... H03K 5/153
[52] U.S. Cl. ................................. 307/361; 307/228; 307/246; 307/518; 328/147; 328/132
[58] Field of Search ............... 307/228, 350, 231, 358, 307/360, 361, 517, 518, 246; 328/114, 117, 132, 147, 135, 149

[56] References Cited

U.S. PATENT DOCUMENTS

| | | | |
|---|---|---|---|
| 3,519,849 | 7/1970 | Tyler | 328/114 |
| 3,676,783 | 7/1972 | Kinbara et al. | 307/358 |
| 3,862,437 | 1/1975 | Rossell | 307/246 |
| 3,989,958 | 11/1976 | Renirie et al. | |
| 3,989,959 | 11/1976 | Renirie et al. | |
| 4,200,843 | 4/1980 | Egami et al. | |

OTHER PUBLICATIONS

J. P. Fouan et al., "A Time Compensation Method for Coincidences Using Large Coaxial Ge(Li) Detectors", Nuclear Instruments and Methods 62, 1968 pp. 327-329.
B. Gottschalk, "Timing Discriminator Uses Leading--Edge Extrapolation" (SLAC-Pub-2592) Aug. 1980.

Primary Examiner—John Zazworsky
Attorney, Agent, or Firm—Clifton E. Clouse, Jr.; Roger S. Gaither; Richard G. Besha

[57] ABSTRACT

A discriminator circuit to recover timing information from slow-rising pulses by means of an output trailing edge, a fixed time after the starting corner of the input pulse, which is nearly independent of risetime and threshold setting. This apparatus comprises means for comparing pulses with a threshold voltage; a capacitor to be charged at a certain rate when the input signal is one-third threshold voltage, and at a lower rate when the input signal is two-thirds threshold voltage; current-generating means for charging the capacitor; means for comparing voltage capacitor with a bias voltage; a flip-flop to be set when the input pulse reaches threshold voltage and reset when capacitor voltage reaches the bias voltage; and a clamping means for discharging the capacitor when the input signal returns below one-third threshold voltage.

10 Claims, 9 Drawing Figures

TIMING DISCRIMINATOR USING LEADING-EDGE EXTRAPOLATION

The government has rights in the invention disclosed herein which was made under, or in, the course of United States Department of Energy Contract No. DE-AC03-76SF00515 with Stanford University.

BACKGROUND OF THE INVENTION

The present invention relates to timing discriminators; and, more particularly, it relates to a timing discriminator that uses leading-edge extrapolation for the recovering of timing information from slow-rising pulses.

To obtain good timing information from slow-rising pulses is an old problem in pulse spectroscopy, and especially in more recent high-energy calorimeter applications. A slow-rising pulse is considered to be a pulse that rises to its peak value in a time of 50 nanoseconds or greater. The output pulse in this type of detector may have a long risetime for several reasons, such as the following:

1. The pulse is derived from many proportional chamber wires ganged together, with drift times varying for any given particle trajectory.
2. The preamplifier is often designed to integrate the incoming charge.
3. Additional high frequency filtering is sometimes used to stabilize the preamplifier in order to reduce high-frequency noise or to provide a pulse shape more suitable for sampling.

Furthermore, these factors may cause a variation in the overall shape of pulses.

To overcome the above problems, the prior art takes advantage of the fact that any pulse carries information about pulse timing which is more accurate than its risetime. This information is recovered by means of a timing discriminator, while imposing an amplitude requirement, or threshold to the input pulse. In general, a timing discriminator is a circuit which produces an output pulse in a fixed relation to the time of the input pulse, if the input pulse is greater than a threshold voltage. Conventional techniques, like zero-crossing and constant fraction, are actually used in connection with timing discriminators to recover pulse risetime information. Discriminator circuits are known in the art, such as the one disclosed in U.S. Pat. No. 3,676,783, issued July 11, 1972, to Setsuro Kinbara et al. In this patent, the pulse-shape discriminating circuit described is suitable for use in the measurement of pulses from radiation detectors. This circuit comprises an input terminal for receiving an input signal; a plurality of characteristic circuits having some characteristics such as differentiation, delay, attenuation, integration, etc.; a plurality of amplitude-discriminating circuits to compare the amplitude of pulses from the characteristic circuits; and a mixing circuit to combine step pulses from the amplitude-discriminating circuits. This device is used to measure an input pulse risetime, independently of amplitude variations, by discriminating between the shape of the pulses. However, this device results in extensive, complex and expensive circuitry.

In the publication, "A Time Compensation Method for Coincidences Using Large Coaxial Ge(Li) Detectors," by Fouan and Passerieux, Nuclear Instruments and Methods 62 (1963) 327–329, a method is described to compensate for the time jitter due to slow and variable pulse rise times. However, no practical embodiment is described here and the complex exposition of the technique affords no details for the development of an embodiment of a timing discriminator circuit.

It is, accordingly, a general object of the invention to improve the recovering of timing information from slow-rising pulses by using leading edge extrapolation in real time mode.

Another object is to improve actual discriminators for high-energy calorimeter applications where long risetime and nonlinear rise are usually expected.

Another object is to provide a practical embodiment with compact, simple and inexpensive circuitry for timing discriminator purposes using the leading edge technique.

SUMMARY OF THE INVENTION

In brief, the invention relates to a discriminator circuit to recover timing information from slow-rising pulses by means of an output trailing edge, which occurs a fixed time after the starting corner of the input pulse, and which is nearly independent of risetime and threshold setting. This device includes comparators for comparing pulses with a threshold voltage, $V_T$, a capacitor to be charged at a certain rate between the crossing of $\frac{1}{3} V_T$ and $\frac{2}{3} V_T$ and at a lower rate thereafter, current sources controlled by comparators to charge the capacitor, a flip-flop which is set by the input pulse and reset by the capacitor voltage ramp and means for discharging the capacitors to start the cycle again.

A difference between the invention and prior art is the realization of a simplified timing discriminator to perform, in real time, the leading edge extrapolation which in prior art was done only by complex circuits or off-line data analysis. In general, leading-edge extrapolation is a technique whereby the times at which the leading edge crosses two fixed levels are recorded and this information is used to extrapolate to the true start of a pulse.

A principal advantage of the invention is that a timing discriminator using this technique can be partially compensated for nonlinearity of an input pulse by adjusting the current value in the current generators.

Another advantage of the invention is that, unlike devices using conventional techniques (such as zero-crossing and constant fraction), the invention is not shape-dependent and does not require a comparator set at a very low bias, which may be troublesome in the presence of baseline noise.

DESCRIPTION OF PREFERRED EMBODIMENT

Reference will now be made in detail to the present preferred embodiment of the invention, examples of which are illustrated in the accompanying drawings.

While the invention will be described in connection with a preferred embodiment, it will be understood that it is not the intention to limit the invention to that embodiment. On the contrary, it is intended to cover all alternatives, modifications, and equivalents, as may be included within the spirit and scope of the invention defined in the appended claims.

Figure 1:
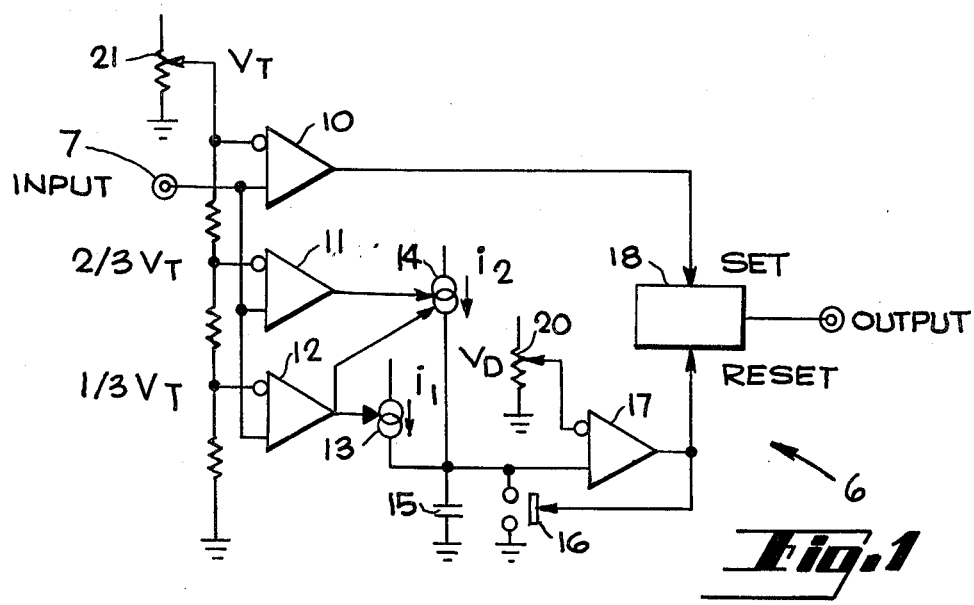
FIG. 1 shows a block diagram of a timing discriminator circuit according to the present invention.

Referring to FIG. 1, a block diagram of a timing discriminator 6 of the preferred embodiment is shown. In the timing discriminator 6, comparator 10 fires when an input pulse applied to an input terminal 7 exceeds a threshold voltage $V_T$, thereby setting a bistable flip-flop 18. In this example, the signals compared by comparator 10 are each input pulse applied to input terminal 7 and the threshold voltage $V_T$ set by a voltage divider 21. The bistable flip-flop 18 is an electrical circuit having two stable states. This circuit remains in either state until caused to change to the other state by application of a corresponding input signal. Also, the comparator 10 and other comparators referred to herein are electric circuits which compare two input signals and then supply an indication of agreement or disagreement in the comparison.

Before comparator 10 is fired, comparators 11 and 12 have fired at $\frac{2}{3} V_T$ and $\frac{1}{3} V_T$, respectively. Current sources 13 and 14, having equal currents $i_1$ and $i_2$, respectively, when activated, are controlled by comparators 11 and 12 so that both are switched on by comparator 12; and, subsequently, source 14 is shut off by comparator 11. Accordingly, a capacitor 15 at the output of sources 13 and 14 is charged at a certain high rate set by sources 13 and 14 between the crossing of $\frac{1}{3} V_T$ and $\frac{2}{3} V_T$ and at a final lower charging rate determined by $i_1$ and capacitor 15 after the input pulse rises to $\frac{2}{3} V_T$. Assuming input pulses with a linear rise and $i_1 = i_2$, the capacitor 15 voltage ramps will eventually reach the same final charging rate for input pulses of whatever slope. This will ensure that capacitor 15 will reach the bias voltage $V_D$ at a fixed time for input pulses of different risetimes. The use of only one current source (13 or 14) will not result in this particular feature of the invention. Discriminator 6 will work correctly with any given threshold voltage $V_T$ and any voltage level, other than $\frac{2}{3} V_T$ and $\frac{1}{3} V_T$. In this case, $i_1$ and $i_2$ should no longer be equal and must be chosen appropriately for the specific voltage levels desired. Also, nonlinear input pulses applied to discriminator 6 will cause a time lag or lead in the activation of the current sources 13 and 14 at $\frac{1}{3} V_T$ and $\frac{2}{3} V_T$ voltage level. This, in turn, will produce a variation in the occurrence time of the output trailing edge, otherwise a fixed time. By adjusting currents $i_1$ and $i_2$ properly, the capacitor 15 charging rate may be varied to overcome this effect for a given set of input pulses. The nonlinearity considered in this invention is that along the input pulse segment from its start to the threshold voltage $V_T$.

Figure 2A:
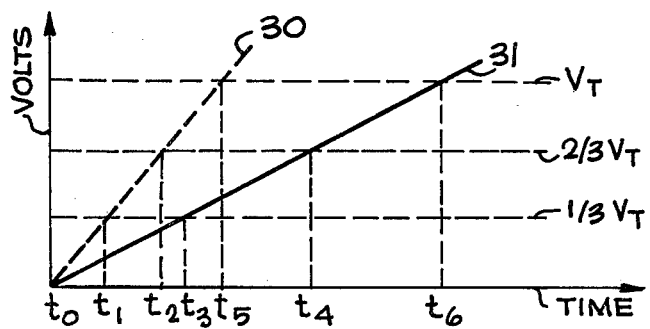
FIGS. 2a, 2b, 2c are graphs showing two input pulses (FIG. 2a) and the corresponding capacitor charging (FIG. 2b) and output waveform (FIG. 2c) of the timing discriminator circuit of FIG. 1.
Figure 2B:
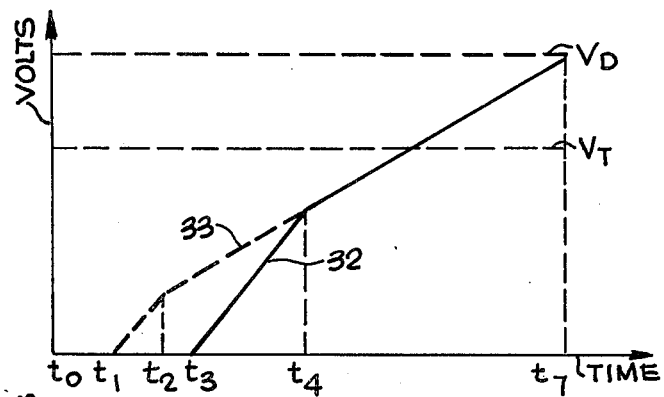
Figure 2C:
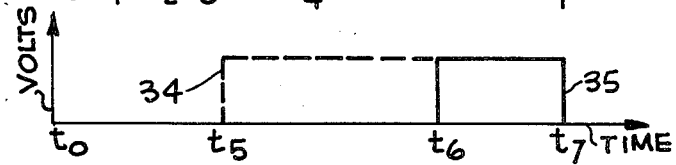

FIGS. 2a, 2b, 2c illustrate the performance of the circuit in FIG. 1. In FIG. 2a, a fast-rise linear input pulse 30 is shown. When resulting voltage ramp 33 (FIG. 2b) across capacitor 15 reaches, at time $t_7$, some fixed voltage $V_D$ set by bias divider 20, a comparator 17 will reset the flip-flop 18. A voltage $V_D$ is set by bias divider 20 at such value that capacitor 15 will reach this voltage at a time longer than it takes for the slowest rising input pulse encountered to reach voltage $V_T$. In this way, the flip-flop 18 resetting will always occur at a later time than its setting by comparator 10, and a waveform similar to waveforms 34 and 35 in FIG. 2c will appear at the output of timing discriminator 6. The trailing edge of output waveform 34, which occurs when capacitor 15 reaches voltage $V_D$, will appear at a constant time $t_7$ after the true starting time $t_0$ of the input pulses, while the leading edge will occur at time $t_5$ when the input pulse 30 crosses $V_T$. Capacitor 15 is discharged by clamp 16 which is controlled by comparator 17.

In FIG. 2a, a slow-rise linear input pulse 31 is shown additionally. The performance of the circuit in FIG. 1 will be the same as above with the corresponding voltage ramp 32 reaching voltage $V_D$ at time $t_7$ and with output waveform 35 leading edge occurring at time $t_6$ and trailing edge occurring at time $t_7$.

From FIGS. 2a, 2b it is observed that at any $V_D$ setting, the trailing edge will occur at a fixed time $t_7$. This occurrence is independent of the pulse risetime. Also, the leading edge occurs at times $t_5$ and $t_6$. This occurrence depends on the time when the input pulse reaches the threshold voltage $V_T$. The leading edge extrapolation makes possible the occurrence of the trailing edge at a fixed time $t_7$ after the true starting time $t_0$ of the input pulses 30 and 31.

Figure 3:
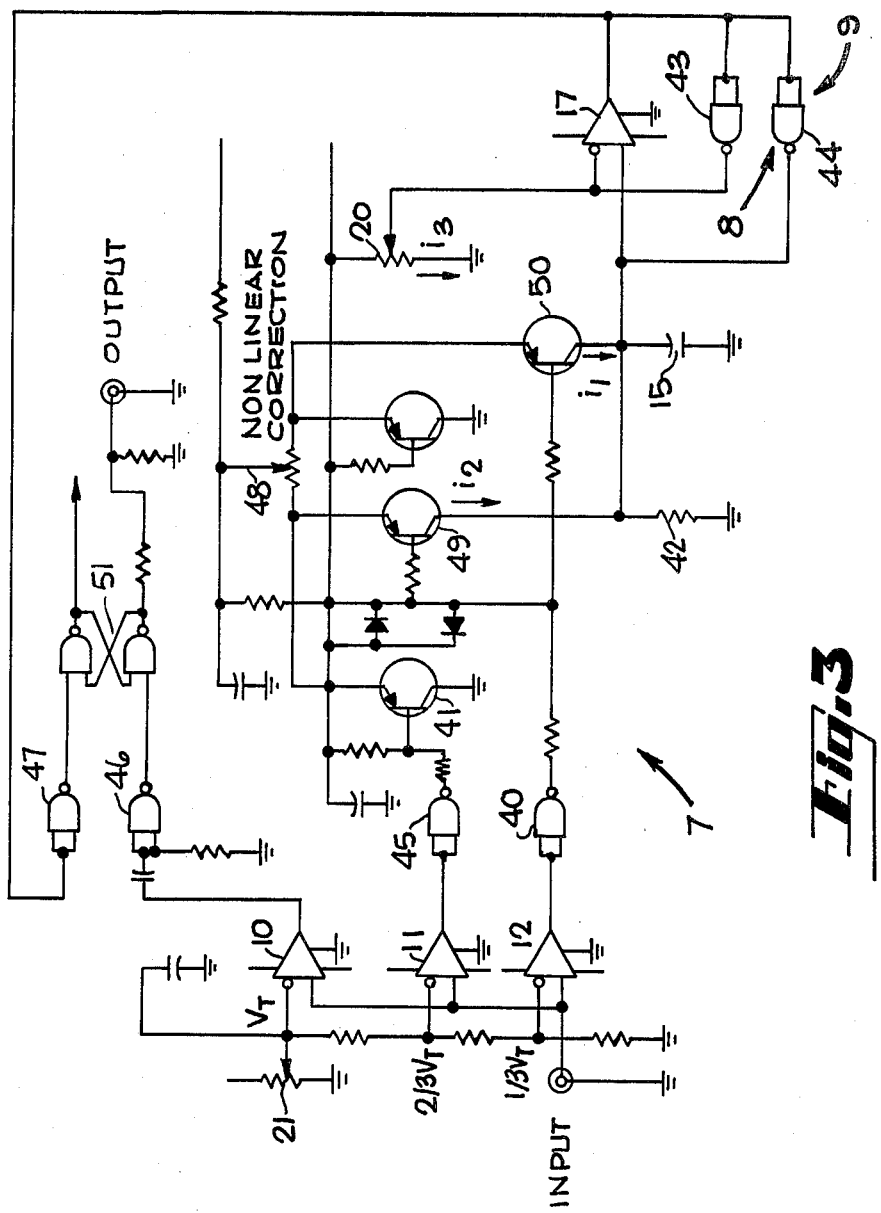
FIG. 3 is a circuit diagram of the timing discriminator circuit of FIG. 1.

A more detailed example of the embodiment is illustrated in FIG. 3. The timing discriminator 7 is suitable for microsecond input pulse spectrum applications. Current generators 49 and 50 are transistors switched on by the positive-going comparator 12 output via inverter 40 when an input pulse reaches $\frac{1}{3}/V_T$. When an input pulse reaches the $\frac{2}{3} V_T$ level, transistor 41 is turned on harder than current generator 49 by comparator 11 via inverter 45, diverting current $i_2$ from capacitor 15. In circuit 7, a nonlinear correction circuit 48 is provided wherein the ratio $i_1/i_2$ may be adjusted to compensate for nonlinearities in an input pulse risetime. Capacitor 15 will be clamped by clamp 44 when the voltage ramp reaches a fixed voltage set on bias divider 20 and kept clamped until the input pulse falls again below $\frac{1}{3} V_T$. This clamping will discharge capacitor 15. Accordingly, identical clamps 43 and 44 controlled by comparator 17 are applied to both capacitor 15 and bias divider 20. Bias divider 20 standing current $i_3$ is deliberately chosen to be lower than $i_1$, and $i_2$, ensuring in clamp 44 that pin 8 will remain more negative than pin 9 until both current generators 49 and 50 are off. Bias divider 20 will allow adjustment for minimum delay of a given set of input pulses. Flip-flop 51 is set by comparator 10 via inverter 46 when threshold voltage $V_T$ is reached and it is reset by comparator 17 via inverter 47 when the capacitor voltage ramp reaches the fixed voltage set on bias divider 20.

An input pulse spectrum may include some pulses that may turn on the current generators 49 and 50 but not long enough to fire comparator 17 and clamp 44 cannot be applied to capacitor 15 for discharging. To solve this problem, leakage resistor 42 is provided to discharge capacitor 15 alternatively. The resistance of leakage resistor 42 is selected to be large enough so that the product of this resistance and currents $i_1$ and $i_2$ be of a value much higher than the fixed voltage set on bias divider 20.

Figure 4A:
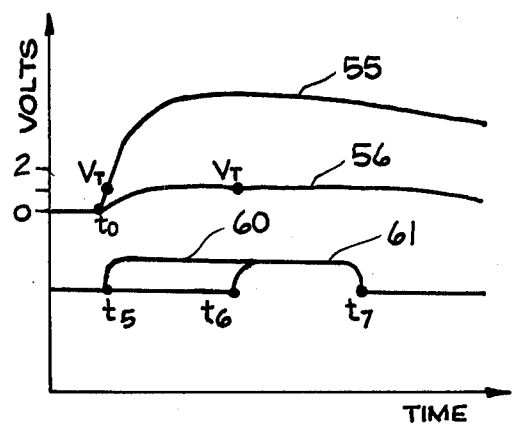
FIGS. 4a, 4b, 4c are graphical representations of the invention performance, when artificial pulses by a conventional pulse-shaping circuit are applied as input to the circuit of FIG. 1., as taken from an actual display on the face of an oscilloscope.
Figure 4B:
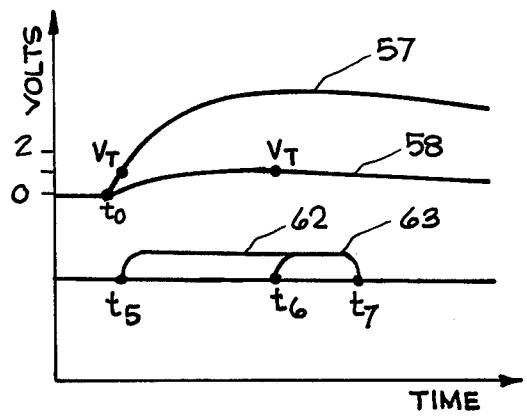
Figure 4C:
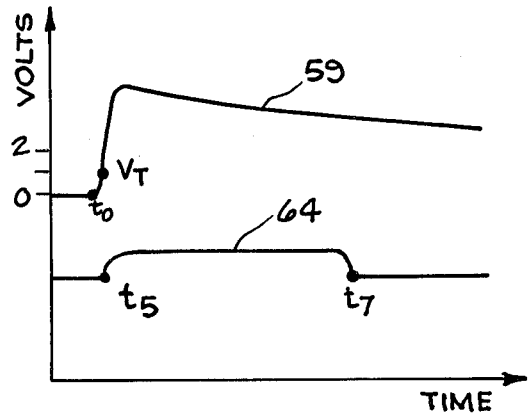

The graphical representations of FIGS. 4a, 4b, 4c illustrate the invention performance for different risetimes of artificial input pulses 55, 56, 57, 58 and 59, applied by a conventional pulse-shaping circuit. The corresponding output pulses for these input pulses are 60, 61, 62, 63 and 64. The threshold voltage $V_T$ in this figure is between 1 and 2 volts. The points marked $V_T$, $t_5$, $t_0$, $t_6$ and $t_7$ in this figure correspond to the similarly designated points in FIG. 2. This figure demonstrates that the time between $t_7$ and $t_0$ remains constant for different risetimes.

Figure 5:
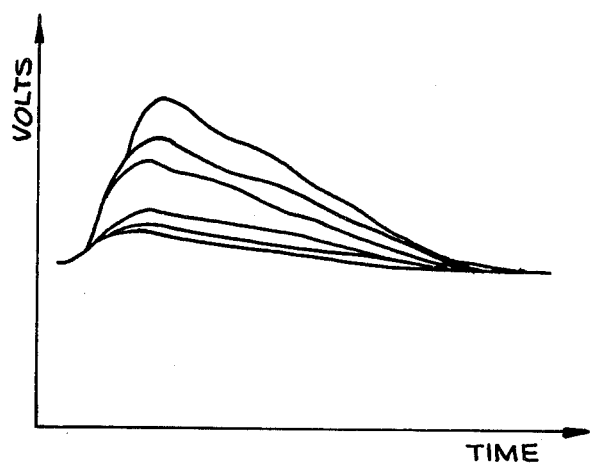
FIG. 5 is a graphical representation of input pulses from a calorimeter that are applied to the input of the circuit of FIG. 1, as taken from an actual display on the face of an oscilloscope.

The graphical representation of FIG. 5 illustrates the kind of input pulses that may be applied to the invention from a calorimeter.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated.

What is claimed is:

1. A timing discriminator for recovering timing information from slow-rising input pulses, which comprises:
    a voltage divider for setting a threshold voltage at a predetermined voltage;
    a first means for comparing said input pulses with said threshold voltage;
    a flip-flop circuit means connected to said first comparing means and set by said first comparing means when said input pulses reach said threshold voltage;
    a second means for comparing said input pulses with two-thirds said threshold voltage;
    a third means for comparing said input pulses with one-third said threshold voltage;
    a first means for generating current connected to said third comparing means and switched on by said third comparing means when said input pulses reach one-third of said threshold voltage;
    a second means for generating current connected to said second comparing means switched on by said third comparing means when said input pulses reach one-third of said threshold voltage and switched off by said second comparing means when said input pulses reach two-thirds of said threshold voltage;
    a capacitor connected to said first and second generating means and charged by said first and second generating means;
    a bias divider for setting a bias voltage at a predetermined level;
    a fourth means for comparing said capacitor voltage with said bias voltage and for resetting said flip-flop circuit means when said capacitor voltage reach said bias voltage; and
    a clamping circuit means connected to said fourth comparing means and said capacitor for discharging said capacitor when said capacitor voltage reaches said bias voltage.

2. The timing discriminator of claim 1, further including a leakage resistor connected across said capacitor for discharging said capacitor when said input pulses switching on said first and second generating means are not long enough to raise said capacitor voltage to said bias voltage.

3. The timing discriminator of claim 2, further including a nonlinear correction circuit means connected to said first and second generating means for maintaining the linearity deviation of said timing information at a minimum, when said input pulses are nonlinear.

4. The timing discriminator of claim 3, wherein said first and second generating means are transistors switched on by said third comparing means.

5. The timing discriminator of claim 4, wherein a voltage inverter means for changing voltage polarity is connected between said third comparing means and said first and second generating means.

6. The timing discriminator of claim 1, wherein said clamping circuit means consist of two identical inverters controlled by said fourth comparing means and connected to said capacitor and said bias divider, to provide clamping for said capacitor until said input pulses are below one-third said threshold voltage and until said first and second generating means are off.

7. A timing device for recovering timing information from input pulses which comprises:
    means to start a square wave when said input pulses reach a predetermined threshold voltage;
    current-generating means responsive to said input pulses to be activated to supply a high charging current when said input pulses reach one-third threshold voltage and to supply charging current that is lower than said high current when said input pulses reach two-third threshold voltage;
    a capacitor connected to said current-generating means for receiving charging current from said current-generating means; and
    means for comparing said capacitor voltage with a predetermined bias voltage to end said square wave when said capacitor and bias voltages are equal.

8. The timing device of claim 7, further comprising means connected across said capacitor for discharging said capacitor.

9. The timing device of claim 7, further comprising means connected to said current-generating means for correction of nonlinearity of said input pulses.

10. The timing device of claim 8, wherein said discharging means includes a resistor for alternatively discharging said capacitor when said capacitor voltage is unable to reach said predetermined bias voltage for ending said square wave.

* * * * *